United States Patent
Khachatryan et al.

(10) Patent No.: US 9,911,918 B2
(45) Date of Patent: Mar. 6, 2018

(54) METHOD OF MANUFACTURING FLEXIBLE DISPLAY APPARATUS

(71) Applicant: Samsung Display Co., Ltd., Yongin-si, Gyeonggi-do (KR)

(72) Inventors: Hayk Khachatryan, Yongin-si (KR); Kihyun Kim, Yongin-si (KR); Sunho Kim, Yongin-si (KR); Jeongho Kim, Yongin-si (KR); Yeongon Mo, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/244,255

(22) Filed: Aug. 23, 2016

(65) Prior Publication Data

US 2017/0062717 A1 Mar. 2, 2017

(30) Foreign Application Priority Data

Aug. 25, 2015 (KR) ........................ 10-2015-0119826

(51) Int. Cl.
*H01L 21/00* (2006.01)
*H01L 51/00* (2006.01)
(Continued)

(52) U.S. Cl.
CPC ........ *H01L 51/003* (2013.01); *H01L 27/3244* (2013.01); *H01L 51/0097* (2013.01);
(Continued)

(58) Field of Classification Search
CPC ................ H01L 51/0097; H01L 51/56; H01L 29/78603; H01L 27/1266; H01L 27/1214; H01L 2251/5338; H01L 2227/326
See application file for complete search history.

(56) References Cited

U.S. PATENT DOCUMENTS 8,237,165 B2* 8/2012 Kim .................... H01L 27/3244
257/59
2005/0269562 A1* 12/2005 Yang ................... H01L 51/0545
257/40
(Continued)

FOREIGN PATENT DOCUMENTS

KR 10-1302494 9/2013
KR 10-2014-0060776 5/2014
(Continued)

OTHER PUBLICATIONS

Sutton et al., "Micromachined Negative Thermal Expansion Thin Films", Transducers 12th International Conference on Solid State Sensors, Actuators and Microsystems, pp. 1148-1151, Jun. 2003.
(Continued)

*Primary Examiner* — Zandra Smith
*Assistant Examiner* — John M Parker
(74) *Attorney, Agent, or Firm* — Knobbe Martens Olson & Bear LLP

(57) ABSTRACT

A manufacturing method of a flexible display apparatus includes forming a sacrificial layer on a carrier, forming a flexible substrate on the sacrificial layer, forming a display element on the flexible substrate, forming a first protection layer on the display element, forming, on the first protection layer, a second protection layer, which has an opposite sign of a thermal expansion coefficient to the first protection layer, separating the flexible substrate from the carrier by removing at least a portion of the sacrificial layer, and separating the first protection layer from the first protection layer.

14 Claims, 5 Drawing Sheets

(51) Int. Cl.
H01L 27/32 (2006.01)
H01L 51/52 (2006.01)
H01L 51/56 (2006.01)

(52) U.S. Cl.
CPC .......... H01L 51/5253 (2013.01); H01L 51/56 (2013.01); *H01L 2227/323* (2013.01); *H01L 2227/326* (2013.01); *H01L 2251/301* (2013.01); *H01L 2251/5338* (2013.01)

(56) References Cited

U.S. PATENT DOCUMENTS

| | | | | |
|---|---|---|---|---|
| 2007/0254456 | A1* | 11/2007 | Maruyama | ....... G06K 19/07749 438/458 |
| 2008/0121415 | A1* | 5/2008 | Oh | ............... B29D 11/0073 174/254 |
| 2010/0051178 | A1 | 3/2010 | Lee et al. | |
| 2012/0026074 | A1* | 2/2012 | Lee | ................. H01L 27/3276 345/76 |
| 2012/0115259 | A1 | 5/2012 | Lee et al. | |
| 2013/0020731 | A1* | 1/2013 | Kim | ................. H01L 51/003 264/1.37 |
| 2013/0032282 | A1 | 2/2013 | Lee et al. | |
| 2013/0157466 | A1 | 6/2013 | Fox et al. | |
| 2014/0131668 | A1 | 5/2014 | Kim | |
| 2015/0187849 | A1* | 7/2015 | Kachatryan | ............ H01L 51/56 257/40 |
| 2016/0225653 | A1* | 8/2016 | Marrs | ................. H01L 21/6835 |

FOREIGN PATENT DOCUMENTS

KR 10-2014-0147086 12/2014
KR 10-2015-0021815 3/2015

OTHER PUBLICATIONS

Gamo et al., "Stress control of hydrogenated amorphous silicon nitride films deposited by plasma-enhanced chemical vapor deposition", https://www.electrochem.org/dl/ma/203/pdfs/0464.pdf.

Lewis, "Material challenge for flexible organic devices", Materialstoday, vol. 9, No. 4, pp. 38-45, Apr. 2006.

Liu et al., "Fabrication of negative thermal expansion $ZrMo_2O_8$ film by sol-gel method", Materials Science and Engineering B 177 (2012), pp. 263-268, journal home page: www.elsevier.com/locate/mseb.

Sutton et al., "Zirconium Tungstate ($ZrW_2O_8$)-Based Micromachined Negative Thermal-Expansion Thin Films", Journal of Microelectromechanical Systems, vol. 13, No. 4, pp. 688-695, Aug. 2004.

"Flexible Display Technology and Market Forecast 2012-2020." Sample excerpt downloaded from www.displaybank.com.

* cited by examiner

METHOD OF MANUFACTURING FLEXIBLE DISPLAY APPARATUS

CROSS-REFERENCE TO RELATED APPLICATION

This application claims the benefit of Korean Patent Application No. 10-2015-0119826, filed on Aug. 25, 2015, in the Korean Intellectual Property Office, the disclosure of which is incorporated herein in its entirety by reference.

BACKGROUND

Field

One or more embodiments relate to a manufacturing method of a flexible display apparatus to prevent cracks in an insulation layer during a manufacturing process.

Description of the Related Technology

According to increased concerns on a flexible display apparatus, research into the flexible display apparatus is actively underway. The flexible display apparatus includes a flexible substrate including an organic compound. The flexible display apparatus has characteristics, such as lightweight and shockproof, and also has advantages, such as being folded and rolled to be stored, and excellent portability.

The flexible display apparatus includes a display element formed on the flexible substrate. The display element includes, for example, an organic light-emitting device, a liquid crystal display device, or an electrophoretic display device. The flexible display apparatus realized by the organic light-emitting device is receiving more attention.

In order to manufacture the flexible display apparatus, the display element and various thin films having various functions should be easily formed on the flexible substrate, and the element and the thin films should be protected from external shocks.

However, a manufacturing method of a conventional flexible display apparatus has problems that cracks occur in previously formed insulation layers due to heat and pressure generated during a manufacturing process.

SUMMARY OF CERTAIN INVENTIVE ASPECTS

One or more embodiments include a manufacturing method of a flexible display apparatus to prevent cracks in an insulation layer during a manufacturing process.

Additional aspects will be set forth in part in the description which follows and, in part, will be apparent from the description, or may be learned by practice of the presented embodiments.

According to one or more embodiments, a manufacturing method of a flexible display apparatus may include forming a sacrificial layer on a carrier, forming a flexible substrate on the sacrificial layer, forming a display element on the flexible substrate, forming a first protection layer on the display element, forming, on the first protection layer, a second protection layer, which has an opposite sign of a thermal expansion coefficient to the first protection layer, separating the flexible substrate from the carrier by removing at least a portion of the sacrificial layer, and separating the first protection layer from the first protection layer.

The sacrificial layer may include molybdenum oxide.

The manufacturing method may further include forming an encapsulation layer on the display element, and the encapsulation layer may include at least one inorganic layer.

One of the first protection layer and the second protection layer may include at least one of zirconium tungstate ($ZrW_2O_8$), zirconium vanadium acid salt ($ZrV_2O_2$), or tungstate scandium ($Sc_2(WO_4)_3$).

Separating the flexible substrate from the carrier may include separating the carrier and the flexible substrate from each other by irradiating a laser beam on an opposite side of the carrier to a side of the carrier on which the sacrificial layer is formed, and removing at least a portion of the sacrificial layer.

The carrier may include a transparent material.

According to one or more embodiments, a manufacturing method of a flexible display apparatus may include forming a sacrificial layer on a carrier, forming a flexible substrate on the sacrificial layer, forming a display element on the flexible substrate, forming a first protection layer on the display element, forming, on the first protection layer, a second protection layer, which has an opposite sign of stress to the first protection layer, separating the flexible substrate from the carrier by removing at least a portion of the sacrificial layer, and separating the first protection layer from the first protection layer.

The sacrificial layer may include molybdenum oxide.

The manufacturing method may further include forming an encapsulation layer on the display element, and the encapsulation layer may include at least one inorganic layer.

An amount of the stress of the first protection layer may be the same as an amount of the stress of the second protection layer.

The one of the first protection layer and the second protection layer may include silicon oxide.

At least one of the first protection layer and the second protection layer may be formed according to a plasma-enhanced chemical vapor deposition (PECVD) method, and one of the first protection layer and the second protection layer may have an opposite sign of stress to the other one of the first protection layer and the second protection layer, and wherein the sign of stress is determined by controlling an amount of gas inside a chamber.

Separating the flexible substrate from the carrier may include separating the carrier and the flexible substrate from each other by irradiating a laser beam on an opposite side of the carrier to a side of the carrier on which the sacrificial layer is formed, and removing at least a portion of the sacrificial layer.

The carrier may include a transparent material.

BRIEF DESCRIPTION OF THE DRAWINGS

These and/or other aspects will become apparent and more readily appreciated from the following description of certain embodiments, taken in conjunction with the accompanying drawings in which.

DETAILED DESCRIPTION OF CERTAIN INVENTIVE EMBODIMENTS

Figure 1:
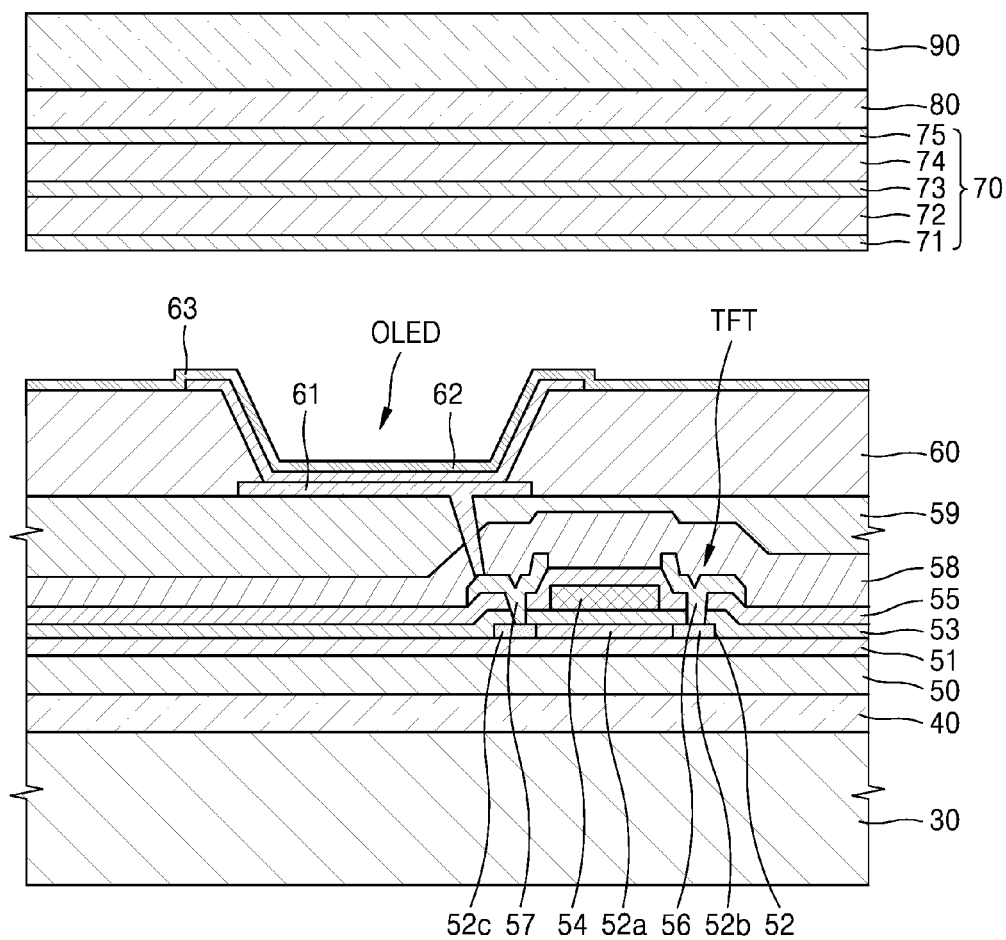
FIGS. 1 through 5 are cross-sectional views schematically illustrating a manufacturing method of a flexible display apparatus according to one embodiment.

The present embodiments may have different forms, and embodiments and should not be construed as being limited to the descriptions set forth herein. Accordingly, the embodiments are merely described below, by referring to the figures, to explain aspects of the present description.

It will be understood that although the terms "first", "second", and the like may be used herein to describe various components, these components should not be limited by these terms. These components are only used to distinguish one component from another.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

Reference will now be made in detail to embodiments, examples of which are illustrated in the accompanying drawings, wherein like reference numerals generally refer to like elements throughout.

FIGS. 1 through 5 are cross-sectional views schematically illustrating a manufacturing method of a flexible display apparatus according to one embodiment.

Referring to FIG. 1, a stack is provided to manufacture the flexible display apparatus. The stack is referred to as a structure in which a carrier 30, a display unit including at least one display element, and protection layers, namely, first and second protection layers 80 and 90, protecting the display unit are sequentially formed on a flexible substrate 50. Hereinafter, the structure of the stack will be explained according to a stacking order.

A sacrificial layer 40 is formed on the carrier 30. The carrier 30 may be thicker than the flexible substrate 50, which is disposed on the carrier 30. Since the flexible substrate 50 is flexible, the flexible substrate 50 may be bendable and extendable when heat or pressure is applied to the flexible substrate 50 during a manufacturing or handling process of the flexible display apparatus. It may be difficult to form thin film patterns, such as various electrodes and conductive wirings, on the flexible substrate 50 at predetermined positions. Accordingly, the carrier 30 may be a substrate having rigidity, such as a substrate including, for example, thick film glass, and may prevent bending and deformation during the manufacturing or handling process.

The carrier 30 may include a transparent material through which a laser beam passes during a process of separating the carrier 30 from the flexible substrate 50.

The sacrificial layer 40 is formed on the carrier 30 and disposed between the carrier 30 and the flexible substrate 50. The sacrificial layer 40 may protect the flexible substrate 50 and facilitate separation during a process of separating the flexible substrate 50 from the carrier 30.

The sacrificial layer 40 may include, for example, molybdenum oxide ($MoO_x$). For example, the sacrificial layer 40 may include $MoO_5$ or $MoO_6$ on the carrier 30 by sputtering molybdenum on the carrier 30 and heat-treating the sputtered molybdenum at a temperature between about 350° C. and about 480° C. in the air. However, embodiments are not limited thereto. A metal oxide including aluminum (Al), titanium (Ti), or the like, a metal oxide such as aluminum zinc oxide (AZO), indium tin oxide (ITO), indium zinc oxide (IZO), or the like, or a semiconductor material such as amorphous silicon, silicon oxide (SiNx), or the like, may be usable to form the sacrificial layer 40.

Thereafter, the flexible substrate 50 is formed on the sacrificial layer 40. This operation may include an operation of coating a material for a flexible substrate on an upper surface of the carrier 30. The material for the flexible substrate may include an organic compound such as, for example, polyimide (PI), polyethylene naphthalate (PEN), polyethylene terephthalate (PET), polyether ether ketone (PEEK), polyethersulfone (PES), polymethyl methacrylate (PMMA), polycarbonate (PC), and polypropylene (PP), or a foil type of a metal. A transparent flexible substrate may be formed by using the PI having thermal resistance and flexibility.

The flexible substrate 50 may be formed on the carrier 30 by using various processes. The flexible substrate 50 may be formed by using a process of coating a liquid material on a flexible substrate and hardening the coated material. The liquid material for the flexible substrate 50 may be coated on the carrier 30 by using a spin coating method or a slit coating method. In another example, a laminating method may be used where flexible substrate 50 and the carrier 30 pass through a pair of rollers with a predetermined heat and pressure such that the flexible substrate 50 is laminated to the carrier 30. The laminating method may not need an additional adhesive between the flexible substrate 50 and the carrier 30 in some embodiments.

Thereafter, the display unit is formed on the flexible substrate 50. In the display unit, at least one display element is electrically connected to at least one thin film transistor. Hereinafter, a structure of the display unit in which an organic light-emitting device is included as the display element will be described.

Common layers, such as a buffer layer 51, a gate insulation film 53, and an interlayer insulation film 55, are formed on the entire flexible substrate 50. The common layers may include an inorganic compound, for example, silicon nitride, silicon oxide (SiO2), silicon oxynitride (SiON), metal oxide, or metal oxynitride.

Also, a semiconductor layer 52 and a thin film transistor TFT including a gate electrode 54, a source electrode 56, and a drain electrode 57 are formed on the flexible substrate 50.

The buffer layer 51 is formed on the flexible substrate 50 and may prevent permeation of impurities into the thin film transistor TFT and the organic light-emitting device of the display unit.

A channel area 52a, a source contact area 52b, and a drain contact area 52c of the semiconductor layer 52 may be patterned on the buffer layer 51. The semiconductor layer 52 may be formed by forming amorphous silicon and converting the amorphous silicon to polysilicon by crystalizing the amorphous silicon. The crystalizing method may include various methods. According to one embodiment, in order to apply this method to the flexible substrate 50, the method may not include a process of heating the flexible substrate 50 with a high temperature. For example, according to a low temperature polysilicon (LTPS) process, a laser beam is irradiated on the semiconductor layer in a short period of time to activate the semiconductor layer 52 such that an exposure time of the flexible substrate 50 to a high temperature is minimized. Accordingly, when the flexible substrate 50 includes an organic compound, the thin film transistor TFT may be stably formed on the flexible substrate 50.

The gate insulation film 53 may be formed on the semiconductor layer 52, and the gate electrode 54 may be formed on a portion of the gate insulation film 53. The gate electrode 54 is electrically connected to a gate line (not illustrated) to apply an on/off signal to the thin film transistor TFT.

The interlayer insulation film 55 may be formed on the gate electrode 54, and the source electrode 56 and the drain electrode 57 may be formed on the interlayer insulation film 55. The source electrode 56 may be electrically connected to the source contact area 52b of the semiconductor layer 52 according to a process of forming a contact hole in the gate insulation film 53 and the interlayer insulation film 55. In a similar process, the drain electrode 57 is electrically connected to the drain contact area 52c of the semiconductor layer 52.

Also, a protection film 58 that covers the thin film transistor TFT, and a planarization film 59 disposed on the protection film 58 and having a flat upper surface may be formed on the entire flexible substrate 50. The planarization film 59 may include an organic compound such as acryl, PI, or benzocyclobutene (BCB).

A pixel electrode 61 patterned on the planarization film 59, an opposite electrode 63, and an intermediate layer 62, including a multilayer including an organic emission layer and disposed between the pixel electrode 61 and the opposite electrode 63, may be formed on the planarization film 59.

The pixel electrode 61 and the opposite electrode 63 may include a transparent (or semi-transparent) electrode or a reflective electrode. For example, when the display apparatus is a bottom emission-type apparatus, to display an image in a direction from the organic emission layer toward the flexible substrate 50, the pixel electrode 61 may include a transparent (or semi-transparent) electrode, and the opposite electrode 63 may include a reflective electrode. When the display apparatus is a top emission-type apparatus, to display an image in a direction away from the flexible substrate 50 from the organic emission layer, the pixel electrode 61 may include a reflective electrode and the opposite electrode 63 may include a transparent (semi-transparent) electrode.

According to another embodiment, which is different from the illustrated embodiment, the intermediate layer 62 may include one layer to be a common electrode to the entire flexible substrate 50 or a portion of the flexible substrate 50, and also include other patterned layers that correspond to the pixel electrode 61. The pixel electrode 61 may be electrically connected to the thin film transistor TFT though a via hole. Therefore, a pixel definition film 60 may be formed on the planarization film 59 with a hole defining a pixel area that corresponds to a front side of the flexible substrate 50 and covering an edge area of the pixel electrode 61.

Thereafter, an encapsulation layer 70 may be formed on the display unit. The encapsulation layer 70 may protect the intermediate layer 62 of the organic light-emitting device OLED and other thin films from moisture or oxygen. The encapsulation layer 70 may include at least one inorganic film. According another embodiment, the encapsulation layer 70 may include at least one organic film in addition to the inorganic film.

As illustrated in FIG. 1, the encapsulation layer 70 may include a stack in which at least one inorganic layer 71, 73, or 75 and at least one organic layer 72 or 74 are alternately stacked. The organic layers 72 and 74 may include epoxy, PI, PET, polycarbonate, polyethylene, or polyacrylate. The inorganic layers 71, 73, and 75 may include silicon oxide, silicon nitride, aluminum oxide, titanium oxide, zirconium oxide, or zinc oxide. An uppermost layer of the encapsulation layer 70 may be the inorganic layer 75 to prevent permeation of moisture into the organic light-emitting device OLED.

Thereafter, a protection layer is formed on the encapsulation layer 70. The protection layer may include the first protection layer 80 and the second protection layer 90. The second protection layer 90 may be disposed on the first protection layer 80.

The second protection layer 90 may include a multi structure having a polymer material. For example, the second protection layer 90 may include a film including a material such as PET, and an adhesive layer formed on a surface of the second protection layer 90 to attach the second protection layer 90 to the first protection layer 80. The adhesive layer may include a layer coated with a pressure sensitive adhesive.

The second protection layer 90 may protect the previously formed organic light-emitting device OLED and encapsulation layer 70 from being damaged during a subsequent process. However, when a laser beam is irradiated to the sacrificial layer 40 to separate the flexible substrate 50 from the carrier 30 in the following process, heat transmitted from the laser beam may cause heat deformation of the second protection layer 90. The second protection layer 90 may expand according to the heat of the laser beam and then contract after the laser beam is irradiated. In this process, first stress may be generated in the second protection layer 90. Thereafter, when a process is performed to separate the flexible substrate 50 from the carrier 30, pressure and shock may be applied to the flexible substrate 50 and the carrier 30, and cracks may occur in an area where the pressure and shock concentrate. The cracks may be propagated to the inorganic layer disposed below the second protection layer 90. When a crack occurs in the encapsulation layer 70 disposed below the second protection layer 90, this causes damage to an organic emission element due to external oxygen and moisture later. Moreover, when the crack is propagated to the insulation film disposed in the display unit, the flexible display apparatus may be damaged and become non-restorable.

Accordingly, the first protection layer 80 may be disposed between the second protection layer 90 and the encapsulation layer 70 and may solve the above-described problems.

According to one embodiment, the first protection layer 80 may include a material having an opposite coefficient of thermal expansion to that of the second protection layer 90. As described above, in case of the thermal deformation of the second protection layer 90, the first protection layer 80 is deformed opposite to the second protection layer 90 and generates second stress in a direction to resist the deformation of the second protection layer 90. The second stress may reduce or offset the first stress generated in the second protection layer 90.

For example, when the second protection layer 90 includes a material having a positive thermal expansion coefficient, the first protection layer 80 may include a material having a negative thermal expansion coefficient. The material having the negative thermal expansion coefficient may include, for example, one of zirconium tungstate ($ZrW_2O_8$), zirconium vanadium acid salts ($ZrV_2O_2$), or tungstate scandium ($Sc_2(WO_4)_3$). However, embodiments are not limited thereto. The second protection layer 90 may have a negative thermal expansion coefficient and the first protection layer 80 may have a positive thermal expansion coefficient.

According another embodiment, the first protection layer 80 may include a material having an opposite sign of stress to that of the second protection layer 90. The second protection layer 90 expands by the heat of the laser beam, and after the irradiation of the laser beam, the second protection layer 90 contracts to have the first stress. The first protection layer 80 may be formed to have the second stress having the opposite sign of the first stress, that is, the second stress in a direction opposite to a direction in which the first stress generates. The second stress of the first protection layer 80 may reduce or offset the first stress of the second protection layer 90. Particularly, when the second stress of the first protection layer 80 has the opposite sign to and same amount as the first stress of the second protection layer 90, the offset effect of the first stress may become great.

The first protection layer 80 may be formed according to various deposition methods, such as, for example, a plasma-enhanced chemical vapor deposition (PECVD) method, or a low pressure chemical vapor deposition (LPCVD) method.

According to the above-described deposition method, when the first protection layer 80 is formed, the first protection layer 80 may be controlled to have a predetermined tensile stress or compressive stress. For example, when the first protection layer 80 is formed according to the PECVD method, a stress value of a deposition film may be controlled by controlling the amount of a reaction gas inside a chamber. The first protection layer 80 may include a material such as silicon nitride or silicon oxide. However, due to electrical characteristics of silicon oxide, it may be relatively difficult to control the stress value of silicon oxide, compared to silicon nitride. When silicon nitride is used, the first protection layer 80 may be easily formed to have the stress value. Therefore, the first protection layer 80 may be formed to have a desirable stress value to prevent detachment of a deposition surface of the first protection layer 80 or to prevent deformation of the first protection layer 80 together with or separately from a deposition surface of the first protection layer 80.

However, the first protection layer 80 does not have to be formed as a stress controlling layer as described above. The first protection layer 80 may be formed as a layer including an adhesive layer or a material such as PET, and the second protection layer 90 is formed as a stress controlling layer.

As described above, the first protection layer 80 according to one embodiment is disposed between the second protection layer 90 and the encapsulation layer 70 and absorbs stress so that the stress generated from the second protection layer 90 is not applied to the encapsulation layer 70. Accordingly, when the second protection layer 90 is thermally deformed by the laser beam, the occurrence of cracks due to the thermal deformation and the propagation of cracks can be blocked, and damage to the previously formed encapsulation layer 70 disposed below the second protection layer 90 and also various films may be prevented.

Hereinafter, a process of separating the flexible substrate 50 from the carrier 30 will be described.

Figure 2:
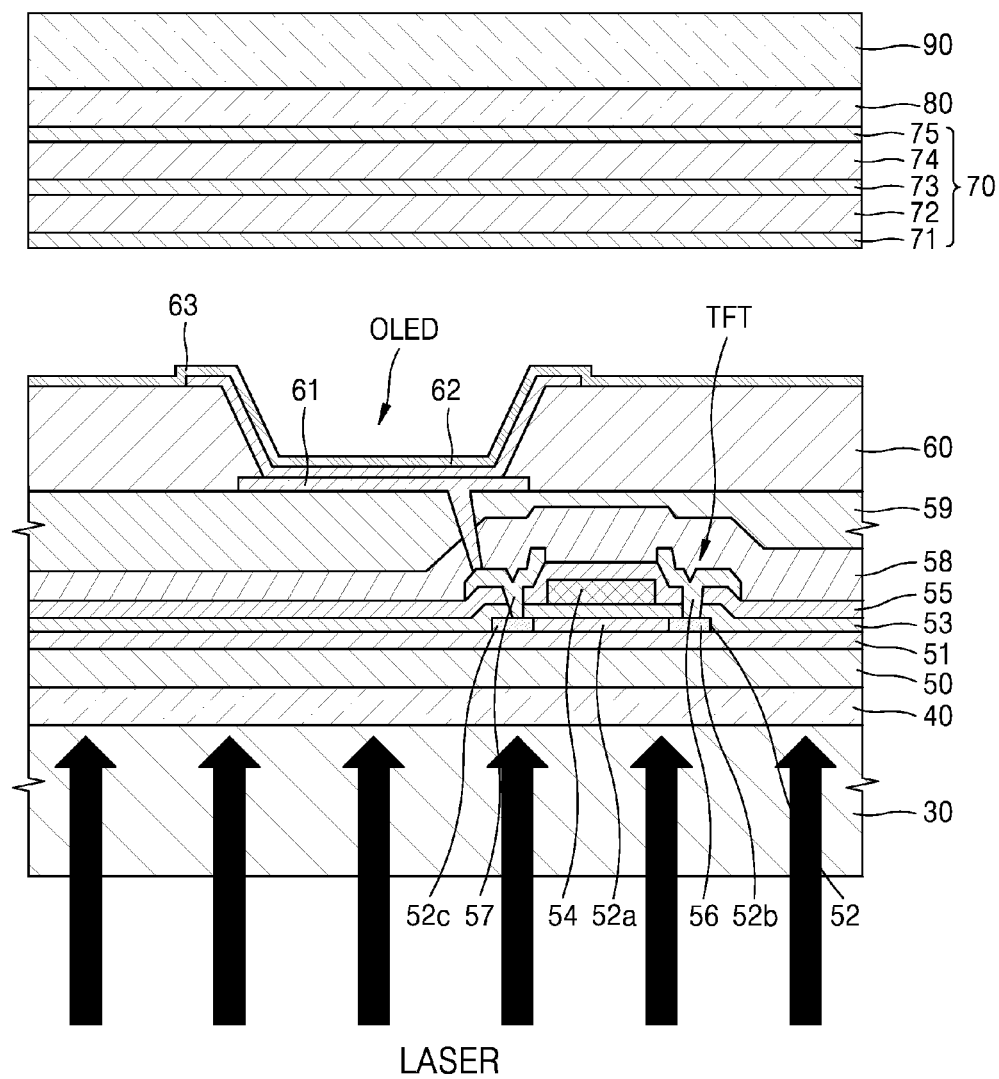

As illustrated in FIG. 2, a laser beam LASER is irradiated from an opposite side of the carrier 30 to a side of the carrier 30 on which the sacrificial layer 40 is formed, to separate the carrier 30 from the stack structure of FIG. 1.

Although not illustrated, a laser source of the laser beam LASER may be disposed adjacent to the carrier 30. When a focus of the laser beam LASER is controlled to be on a boundary of the sacrificial layer 40 and the flexible substrate 50, light may concentrate at the boundary of the flexible substrate 50 and the sacrificial layer 40. When heat caused by the laser beam LASER is absorbed by the flexible substrate 50, molecules that are adjacent to a surface of the flexible substrate 50 may be dissolved. When the pixel electrode 61 includes a reflective electrode, the laser beam LASER is reflected from a lower side of the pixel electrode 61 and thus degradation of the intermediate layer 62 including the organic emission layer may be prevented.

Figure 3:
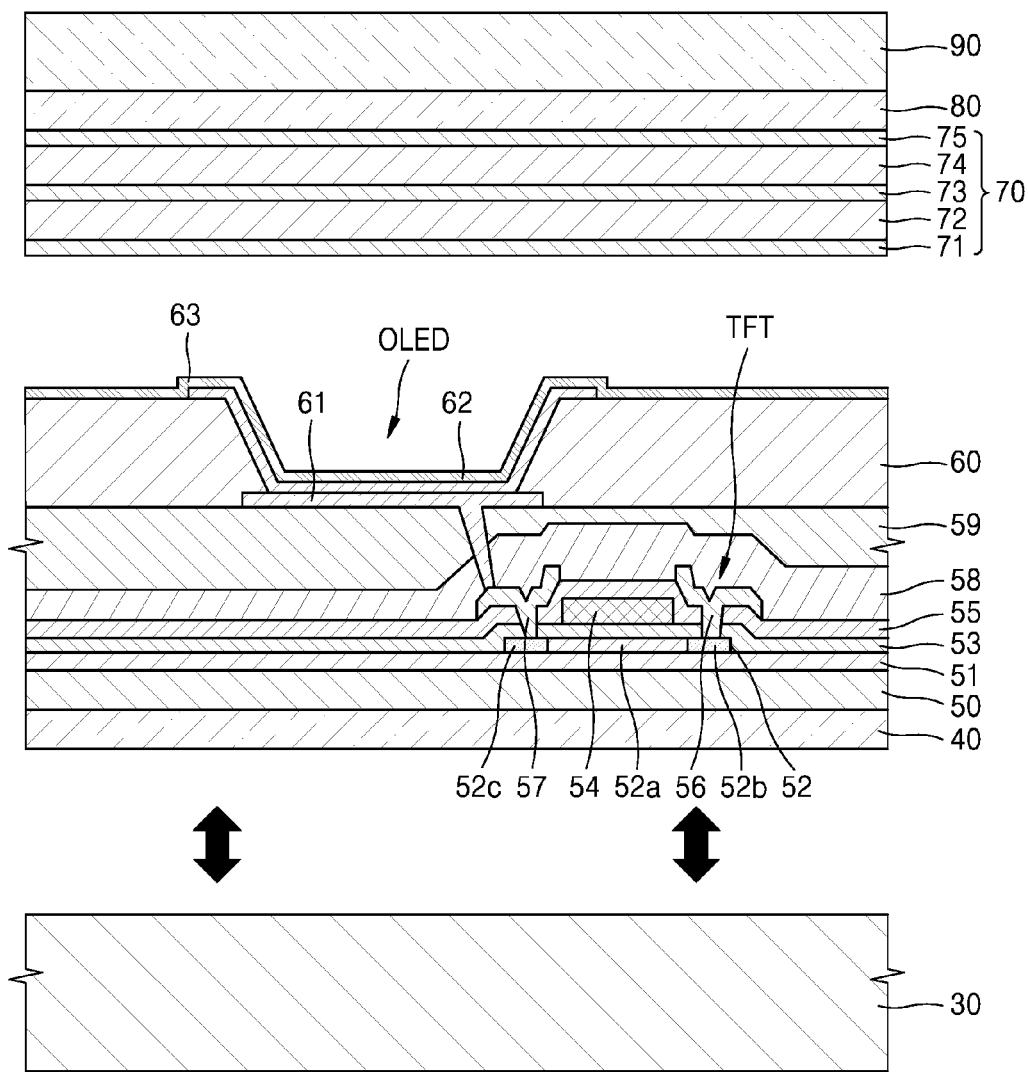

Thereafter, as illustrated in FIG. 3, the flexible substrate 50 is separated from the carrier 30. As described above, molecules of the surface of the flexible substrate 50 are dissolved by the laser beam LASER, and thus an adhesive force may be disposed between the flexible substrate 50 and the sacrificial layer 40. Accordingly, at least a portion of the sacrificial layer 40 is separated from the flexible substrate 50, and thus the flexible substrate 50 and the carrier 30, which are disposed opposite to each other with respect to the sacrificial layer 40, may be separated from each other.

Meanwhile, although the heat of the laser beam LASER is transmitted to the first and second protection layers 80 and 90 disposed on the encapsulation layer 70, the first protection layer 80 and the second protection layer 90 are formed to have opposite stresses to each other to prevent the occurrence of cracks in the encapsulation layer 70 and films of the display unit during the process of separating the flexible substrate 50 and the carrier 30 from each other.

Figure 4:
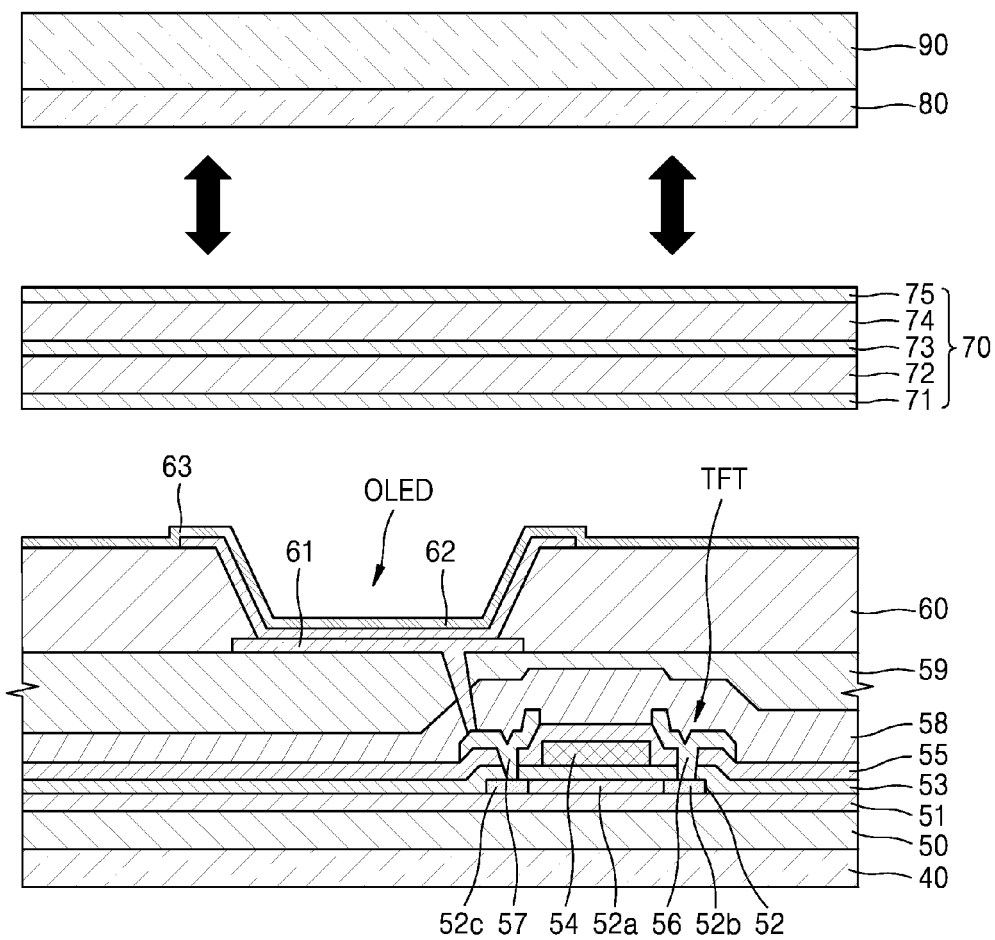

Thereafter, as illustrated in FIG. 4, the first protection layer 80 is separated from the encapsulation layer 70. Various methods may be used to separate the first protection layer 80 and the encapsulation layer 70 from each other. For example, a cutting knife or tape may be mechanically used, or UV irradiation and various heat treatments may be used for the separation process.

Figure 5:
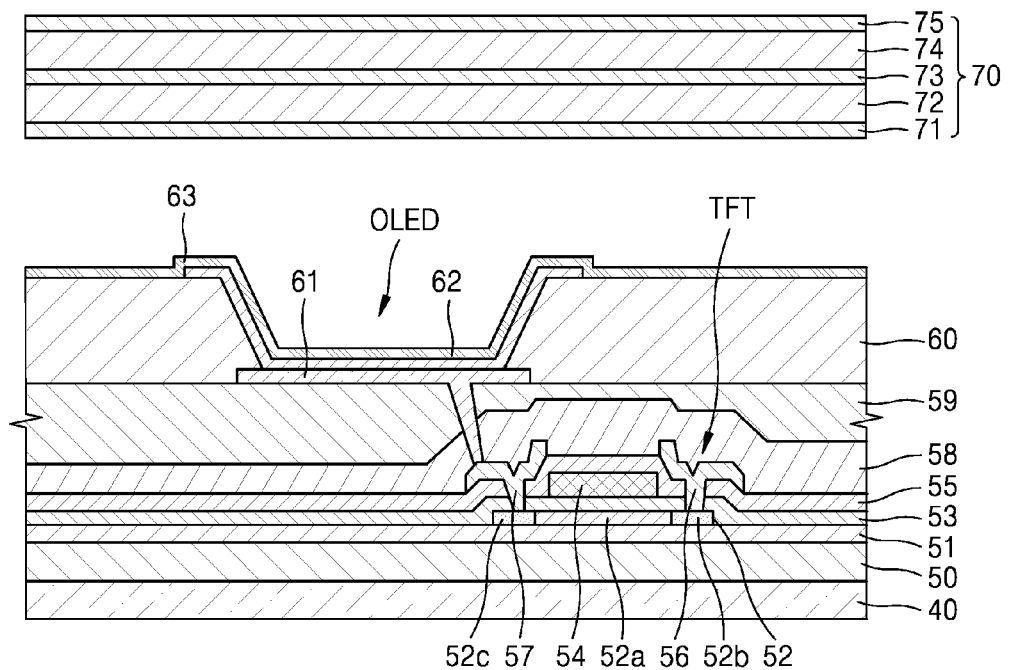

Thereafter, as illustrated in FIG. 5, the flexible display apparatus including the display unit and the encapsulation layer 70 disposed on the flexible substrate 50 may be completely formed.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A manufacturing method of a flexible display apparatus, the method comprising:
    forming a sacrificial layer on a carrier;
    forming a flexible substrate on the sacrificial layer;
    forming a display element on the flexible substrate;
    forming a first protection layer on the display element;
    forming, on the first protection layer, a second protection layer, the second protection layer and the first protection layer having a stacking structure, the second protection layer formed of a different material from the first protection layer and having an opposite sign of a thermal expansion coefficient to the first protection layer;
    separating the flexible substrate from the carrier by removing at least a portion of the sacrificial layer; and
    separating the first protection layer from the display element.

2. The manufacturing method of claim 1, wherein the sacrificial layer comprises molybdenum oxide.

3. The manufacturing method of claim 1, further comprising:
    forming an encapsulation layer on the display element, wherein the encapsulation layer comprises at least one inorganic layer.

4. The manufacturing method of claim 1, wherein one of the first protection layer and the second protection layer includes at least one of zirconium tungstate ($ZrW_2O_8$), zirconium vanadium acid salt ($ZrV_2O_2$), or tungstate scandium ($Sc_2(WO_4)_3$).

5. The manufacturing method of claim 1, wherein separating the flexible substrate from the carrier comprises separating the carrier and the flexible substrate from each other by irradiating a laser beam on an opposite side of the carrier to a side of the carrier on which the sacrificial layer is formed, and removing at least a portion of the sacrificial layer.

6. The manufacturing method of claim 1, wherein the carrier comprises a transparent material.

7. A manufacturing method of a flexible display apparatus, the method comprising:
   forming a sacrificial layer on a carrier;
   forming a flexible substrate on the sacrificial layer;
   forming a display element on the flexible substrate;
   forming a first protection layer on the display element;
   forming, on the first protection layer, a second protection layer, the second protection layer and the first protection layer having a stacking structure, the second protection layer formed of a different material from the first protection layer and having an opposite sign of stress to the first protection layer;
   separating the flexible substrate from the carrier by removing at least a portion of the sacrificial layer; and
   separating the first protection layer from the display element.

8. The manufacturing method of claim 7, wherein the sacrificial layer comprises molybdenum oxide.

9. The manufacturing method of claim 7, further comprising:
   forming an encapsulation layer on the display element,
   wherein the encapsulation layer comprises at least one inorganic layer.

10. The manufacturing method of claim 7, wherein an amount of the stress of the first protection layer is the same as an amount of the stress of the second protection layer.

11. The manufacturing method of claim 7, wherein at least one of the first protection layer and the second protection layer comprises silicon oxide.

12. The manufacturing method of claim 7, wherein at least one of the first protection layer and the second protection layer is formed according to a plasma-enhanced chemical vapor deposition (PECVD) method, and at least one of the first protection layer and the second protection layer has an opposite sign of stress to the other one of the first protection layer and the second protection layer, and wherein the sign of stress is determined by controlling an amount of gas inside a chamber.

13. The manufacturing method of claim 7, wherein separating the flexible substrate from the carrier comprises separating the carrier and the flexible substrate from each other by irradiating a laser beam on an opposite side of the carrier to a side of the carrier on which the sacrificial layer is formed, and removing at least a portion of the sacrificial layer.

14. The manufacturing method of claim 7, wherein the carrier comprises a transparent material.

* * * * *